(12) United States Patent
Yu

(10) Patent No.: US 11,600,627 B2
(45) Date of Patent: Mar. 7, 2023

(54) MEMORY AND METHOD FOR FORMING THE SAME

(71) Applicant: Shanghai Huahong Grace Semiconductor Manufacturing Corporation, Shanghai (CN)

(72) Inventor: Tao Yu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 102 days.

(21) Appl. No.: 16/909,619

(22) Filed: Jun. 23, 2020

(65) Prior Publication Data
US 2021/0296330 A1    Sep. 23, 2021

(30) Foreign Application Priority Data

Mar. 18, 2020   (CN) .............................. 202010192701

(51) Int. Cl.
| | |
|---|---|
| *H01L 27/11517* | (2017.01) |
| *H01L 29/66* | (2006.01) |
| *H01L 29/423* | (2006.01) |
| *G11C 5/02* | (2006.01) |
| *H01L 29/788* | (2006.01) |

(52) U.S. Cl.
CPC ........ *H01L 27/11517* (2013.01); *G11C 5/025* (2013.01); *H01L 29/42328* (2013.01); *H01L 29/66825* (2013.01); *H01L 29/788* (2013.01)

(58) Field of Classification Search
CPC ......... H01L 29/66825; H01L 29/40114; H01L 27/1157; H01L 29/7841; H01L 29/7831; H01L 29/78645; H01L 29/42328; H01L 27/11206; H01L 29/1453; H01L 23/525–5258; H01L 27/115–11597; H01L 2924/1438; H01L 27/11517; H01L 29/788; G11C 17/14–165; G11C 16/00–349; G11C 11/5621–5642; G11C 16/0408–0458; G11C 2216/06–10
See application file for complete search history.

(56) References Cited

U.S. PATENT DOCUMENTS

| | | | | |
|---|---|---|---|---|
| 7,611,941 B1 * | 11/2009 | Shum | ................ | H01L 29/40114 438/211 |
| 8,778,761 B2 * | 7/2014 | Gu | .................... | H01L 27/11524 257/E21.422 |
| 8,780,625 B2 * | 7/2014 | Gu | ........................ | G11C 16/26 365/185.26 |

(Continued)

*Primary Examiner* — Maliheh Malek
(74) *Attorney, Agent, or Firm* — Harness, Dickey & Pierce, P.L.C.

(57) ABSTRACT

The present disclosure provides a memory and a method for forming the memory. The memory includes: a substrate including a first storage area and a second storage area; a source region disposed in the substrate between the first storage area and the second storage area; a first drain region and a second drain region in the substrate on both sides of the first storage area and the second storage area; a first storage structure disposed on the first storage area, including a first storage unit, a second storage unit, and a first word line gate; and a second storage structure disposed on the second storage area, including a third storage unit, a fourth storage unit, and a second word line gate. The memory can obtain an improved performance.

8 Claims, 8 Drawing Sheets

(56) References Cited

U.S. PATENT DOCUMENTS

| | | | | |
|---|---|---|---|---|
| 9,343,466 B1* | 5/2016 | Zhang | ............... | H01L 29/40114 |
| 9,406,687 B1* | 8/2016 | Yang | ............... | H01L 29/7881 |
| 9,842,845 B1* | 12/2017 | Melde | ............... | H01L 27/11539 |
| 9,853,039 B1* | 12/2017 | Kang | ............... | H01L 27/11521 |
| 10,700,174 B2* | 6/2020 | Liu | ............... | G11C 16/0458 |
| 10,790,021 B2* | 9/2020 | Hu | ............... | G11C 16/0425 |
| 11,018,233 B2* | 5/2021 | Chu | ............... | H01L 29/66825 |
| 11,081,557 B2* | 8/2021 | Yu | ............... | H01L 23/535 |
| 11,145,511 B1* | 10/2021 | Gao | ............... | H01L 29/66734 |
| 2004/0183118 A1* | 9/2004 | Chen | ............... | H01L 29/7885 |
| | | | | 257/314 |
| 2004/0196720 A1* | 10/2004 | Hung | ............... | H01L 27/115 |
| | | | | 257/E27.103 |
| 2004/0197996 A1* | 10/2004 | Chen | ............... | H01L 29/42336 |
| | | | | 257/E21.422 |
| 2005/0045940 A1* | 3/2005 | Chen | ............... | H01L 27/115 |
| | | | | 257/315 |
| 2005/0176201 A1* | 8/2005 | Liu | ............... | H01L 29/42324 |
| | | | | 438/257 |
| 2007/0200165 A1* | 8/2007 | Jeong | ............... | H01L 27/115 |
| | | | | 257/315 |
| 2007/0221987 A1* | 9/2007 | Nagai | ............... | H01L 27/11519 |
| | | | | 257/E29.302 |
| 2008/0054345 A1* | 3/2008 | Park | ............... | H01L 29/42324 |
| | | | | 257/E21.409 |
| 2013/0223148 A1* | 8/2013 | Seo | ............... | H01L 27/11521 |
| | | | | 365/185.11 |
| 2016/0027792 A1* | 1/2016 | Zhang | ............... | H01L 29/42328 |
| | | | | 438/264 |
| 2016/0181265 A1* | 6/2016 | Regnier | ............... | H01L 27/11524 |
| | | | | 438/258 |
| 2017/0040334 A1* | 2/2017 | Cheng | ............... | H01L 28/00 |
| 2017/0117372 A1* | 4/2017 | Li | ............... | H01L 27/11534 |
| 2017/0141201 A1* | 5/2017 | Fang | ............... | H01L 29/665 |
| 2017/0221916 A1* | 8/2017 | Tseng | ............... | H01L 29/42344 |
| 2017/0330949 A1* | 11/2017 | Wang | ............... | H01L 21/70 |
| 2018/0012898 A1* | 1/2018 | Wu | ............... | H01L 29/66825 |
| 2018/0102414 A1* | 4/2018 | Liu | ............... | H01L 29/42328 |
| 2018/0151585 A1* | 5/2018 | Shu | ............... | H01L 29/518 |
| 2018/0151753 A1* | 5/2018 | Yang | ............... | H01L 29/42344 |
| 2018/0301562 A1* | 10/2018 | Li | ............... | H01L 27/11521 |
| 2019/0088667 A1* | 3/2019 | Yeh | ............... | H01L 29/7881 |
| 2019/0088668 A1* | 3/2019 | Yeh | ............... | H01L 27/11521 |
| 2019/0140063 A1* | 5/2019 | Liu | ............... | H01L 29/0649 |
| 2019/0140099 A1* | 5/2019 | Si | ............... | G11C 16/045 |
| 2019/0326305 A1* | 10/2019 | Zhou | ............... | H01L 29/66825 |
| 2019/0355824 A1* | 11/2019 | Liu | ............... | G11C 16/0458 |
| 2020/0105775 A1* | 4/2020 | Huang | ............... | H01L 29/4916 |
| 2020/0303387 A1* | 9/2020 | Yeh | ............... | H01L 27/11531 |
| 2021/0066323 A1* | 3/2021 | Huang | ............... | H01L 23/5226 |
| 2021/0202706 A1* | 7/2021 | Wang | ............... | H01L 29/66825 |
| 2021/0358927 A1* | 11/2021 | Wang | ............... | G11C 16/0425 |
| 2022/0216315 A1* | 7/2022 | Lin | ............... | H01L 29/42328 |
| 2022/0223740 A1* | 7/2022 | Melde | ............... | H01L 27/11524 |

* cited by examiner

MEMORY AND METHOD FOR FORMING THE SAME

CROSS-REFERENCE TO RELATED APPLICATIONS

This application claims the benefit of priority to Chinese patent application No. 202010192701.5, filed on Mar. 18, 2020, the entire contents of which are incorporated herein by reference.

TECHNICAL FIELD

The present disclosure relates to the field of semiconductor manufacturing, and more particularly to a memory and a method for forming the memory.

BACKGROUND

In current semiconductor industry, integrated circuit products can be divided into three major types: analog circuit, digital circuit and digital/analog hybrid circuit, in which memory is an important type of digital circuit. In recent years, the flash memory is developed particularly rapidly. A main feature of the flash memory is that it can keep stored information for a long time without power, and it has the advantages of high integration, fast storage speed, easy to erase and rewrite, so it has been widely used in many fields such as microcomputer, and automatic control.

The flash memory can be divided into two types: stack gate flash memory and split gate flash memory. Stack flash memory has a floating gate and a control gate above the floating gate. Stack flash memory has a problem of over erasure. Different from the stack flash memory, split flash memory includes a word line as an erasing gate on one side of the floating gate, thus split gate flash memory can effectively avoid over erasure.

However, the existing split gate flash memory is still poor in performance.

SUMMARY

Embodiments of the present disclosure provide a memory and a method for forming the memory, and a memory unit array and a method for driving the memory unit array, in order to improve the performance of the memory.

An embodiment of the present disclosure provides a memory, including: a substrate, including a first storage area and a second storage area which are close to and separated from each other; a source region, disposed in the substrate between the first storage area and the second storage area; a first drain region and a second drain region, disposed in the substrate on both sides of the first storage area and the second storage area; a first storage structure, disposed on the first storage area, wherein the first storage structure includes a first storage unit, a second storage unit, and a first word line gate between the first storage unit and the second storage unit; and a second storage structure, disposed on the second storage area, wherein the second storage structure includes a third storage unit, a fourth storage unit, and a second word line gate between the third storage unit and the fourth storage unit.

In some embodiments, the memory further includes: a source line, disposed on the source region between the first storage structure and the second storage structure and electrically coupled with the source region.

In some embodiments, the memory further includes: a first plug, disposed on the first drain region and electrically coupled with the first drain region; and a second plug, disposed on the second drain region and electrically coupled with the second drain region.

In some embodiments, the first storage unit is close to the first drain region and the second storage unit is close to the source region.

In some embodiments, the third storage unit is close to the second drain region and the fourth storage unit is close to the source region.

In some embodiments, the first storage unit includes: a first floating gate structure, disposed on a portion of a surface of the first storage area; and a first control gate structure disposed on a surface of the first floating gate structure; wherein the second storage unit includes: a second floating gate structure, disposed on a portion of the surface of the first storage area; and a second control gate structure, disposed on a surface of the second floating gate structure.

In some embodiments, the third storage unit includes: a third floating gate structure, disposed on a portion of a surface of the second storage area; and a third control gate structure, disposed on a surface of the third floating gate structure; wherein the fourth storage unit includes: a fourth floating gate structure, disposed on a portion of the surface of the second storage area; and a fourth control gate structure, disposed on a surface of the fourth floating gate structure.

In some embodiments, the first storage structure further includes: a first sidewall, disposed on a top surface of the first control gate structure and a top surface of the second control gate structure; wherein the second storage structure further includes: a second sidewall, disposed on a top surface of the third control gate structure and a top surface of the fourth control gate structure.

In some embodiments, the first storage structure further includes: a third sidewall, disposed on sidewall surfaces of the first storage unit and the first sidewalls close to the first drain region; wherein the second storage structure further includes: a fourth sidewall, disposed on sidewall surfaces of the third storage unit and the second sidewalls close to the second drain region.

In some embodiments, the memory according to claim 2 further includes: a fifth sidewall, disposed on sidewall surfaces of both sides of the source line, wherein the fifth sidewall is disposed between the source line and the second storage unit, and between the source line and the fourth storage unit.

Another embodiment of the present disclosure provides a method for forming a memory, including: providing a substrate including a first storage area and a second storage area which are close to and separated from each other; forming a first storage structure on the first storage area, wherein the first storage structure includes a first storage unit, a second storage unit, and a first word line gate between the first storage unit and the second storage unit; forming a second storage structure on the second storage area, wherein the second storage structure includes a third storage unit, a fourth storage unit, and a second word line gate between the third storage unit and the fourth storage unit; forming a source region in the substrate between the first storage area and the second storage area after forming the first storage structure and the second storage structure; and forming a first drain region and a second drain region in the substrate on both sides of the first storage area and the second storage area after forming the source region.

In some embodiments, the first storage structure and the second storage structure are formed in a same process.

In some embodiments, forming the first storage structure further includes: forming a first sidewall on a top surface of the first storage unit and a top surface of the second storage unit; and forming the second storage structure further includes: forming a second sidewall on a top surface of the third storage unit and a top surface of the fourth storage unit.

In some embodiments, forming the first storage unit, the second storage unit, the third storage unit, the fourth storage unit, the first word line gate, and the second word line gate includes: forming a storage unit material film on a surface of the first storage area and a surface of the second storage area; forming a mask layer on a surface of the storage unit material film, wherein the mask layer has a first groove in the first storage area and a second groove in the second storage area; forming the first sidewall on a sidewall surface of the first groove and forming the second sidewall on a sidewall surface of the second groove, wherein the first sidewall and the second sidewall are disposed on the surface of the storage unit material film; etching the storage unit material film with the mask layer, the first sidewalls and the second sidewalls as a mask to form a first opening structure and a second opening structure in the storage unit material film, to form the first storage unit and the second storage unit in the first storage area, and to form the third storage unit and the fourth storage unit in the second storage area, wherein the first opening structure is disposed between the first storage unit and the second storage unit, and the second opening structure is disposed between the third storage unit and the fourth storage unit; and forming the first word line gate in the first opening structure and forming the second word line gate in the second opening structure.

In some embodiments, the storage unit material film is further disposed on the source region, and the mask layer covers the storage unit material film on the source region, and the method further includes: forming a sacrificial storage unit on the source region after etching the storage unit material film with the mask layer, the first sidewalls and the second sidewalls as the mask, wherein the sacrificial storage unit is disposed between the second storage unit and the fourth storage unit.

In some embodiments, the storage unit material film includes: a floating gate dielectric film; a floating gate electrode film on a surface of the floating gate dielectric film; a control gate dielectric film on a surface of the floating gate electrode film; and a control gate electrode film on a surface of the control gate dielectric film, and the method further includes: etching the storage unit material film with the mask layer, the first sidewalls and the second sidewalls as the mask to form a first floating gate structure and a second floating gate structure on the first storage area, to form a first control gate structure on a surface of the first floating gate structure and a second control gate structure on a surface of the second floating gate structure, to form a third floating gate structure and a fourth floating gate structure on the second storage area, and to form a third control gate structure on a surface of the third floating gate structure and a fourth control gate structure on a surface of the fourth floating gate structure.

In some embodiments, the first storage unit includes the first floating gate structure disposed on the surface of the first storage area and the first control gate structure disposed on the surface of the first floating gate structure; the second storage unit includes the second floating gate structure disposed on the surface of the first storage area and the second control gate structure disposed on the surface of the second floating gate structure; the third storage unit includes the third floating gate structure disposed on the surface of the second storage area and the third control gate structure disposed on the surface of the third floating gate structure; and the fourth storage unit includes the fourth floating gate structure disposed on the surface of the second storage area and the fourth control gate structure disposed on the surface of the fourth floating gate structure.

In some embodiments, forming the source region includes: removing the sacrificial storage unit to expose a surface of the substrate so as to form a third opening structure, wherein sidewall surfaces of the first sidewalls, the second sidewalls, the second storage unit and the fourth storage unit are exposed from the third opening structure; and performing an ion doping process on the substrate between the first storage area and the second storage area to form the source region.

In some embodiments, the method further includes: forming a source line in the third opening structure after forming the source region and before forming the first drain region and second drain region, wherein the source line is disposed between the first storage structure and the second storage structure.

In some embodiments, the method further includes: forming a fifth sidewall on a sidewall surface of the third opening structure after forming the third opening structure and before forming the source region.

In some embodiments, the method further includes: forming a first plug on the first drain region after forming the first drain region, and forming a second plug on the second drain region after forming the second drain region, wherein the first plug is electrically coupled with the first drain region, and the second plug is electrically coupled with the second drain region.

In some embodiments, the storage unit material film is also disposed on the surface of the substrate on both sides of the first storage area and the second storage area, and forming the first drain region and the second drain region includes: removing the storage unit material film and the mask layer on the substrate on both sides of the first storage area and the second storage area to expose the surface of the substrate; and performing an ion doping process on the substrate to form the first drain region and the second drain region on the substrate on both sides of the first storage area and the second storage area.

Still another embodiment of the present disclosure provides a memory unit array, including: a substrate, including a plurality of discrete active areas disposed in parallel along a second direction, and an isolation structure surrounding the plurality of discrete active areas, where the plurality of discrete active areas extend along a first direction, each active area includes a plurality of memory unit areas in the first direction, and each memory unit area includes a first storage area and a second storage area which are close to and separated from each other; a plurality of first drain regions and a plurality of second drain regions, each first drain region and each second drain region being respectively disposed in the substrate on both sides of the first storage area and the second storage area; a plurality of source regions, each source region being disposed in the substrate between the first storage area and the second storage area; a plurality of first storage structures, each first storage structure being disposed on each first storage area, and each first storage structure including a first storage unit, a second storage unit, and a first word line gate between the first storage unit and the second storage unit; a plurality of second storage structures, each second storage structure being disposed on each second storage area, and the second storage structure including a third storage unit, a fourth storage unit, and a second word line gate between the third storage unit and the fourth storage unit; a plurality of source lines disposed in parallel along the first direction, each source line being electrically coupled with each source region; and a plurality of bit lines disposed in parallel along the second direction, each bit line being electrically coupled with the first drain region and the second drain region in a same column.

In some embodiments, the memory unit array further includes: a plurality of first control lines disposed in parallel along the first direction, each of the plurality of first control lines being electrically coupled with the first storage unit in a same row; a plurality of second control lines disposed in parallel along the first direction, each of the plurality of second control lines being electrically coupled with the second storage unit in a same row; a plurality of third control lines disposed in parallel along the first direction, each of the plurality of third control line being electrically coupled with the third storage unit in a same row; a plurality of fourth control lines disposed in parallel along the first direction, each of the plurality of fourth control lines being electrically coupled with the fourth storage unit in a same row; a plurality of first word lines disposed in parallel along the first direction, each of the plurality of first word line being electrically coupled with the first word line gate in a same row; and a plurality of second word lines disposed in parallel along the first direction, each of the plurality of second word line being electrically coupled with the second word line gate in a same row.

In some embodiments, adjacent memory unit areas share the first drain region or the second drain region along the first direction.

In some embodiments, the first storage unit includes: a first floating gate structure, disposed on a portion of a surface of the first storage area; and a first control gate structure disposed on a surface of the first floating gate structure; the second storage unit includes: a second floating gate structure disposed on a portion of the surface of the first storage area; and a second control gate structure disposed on a surface of the second floating gate structure; the third storage unit includes: a third floating gate structure disposed on a portion of a surface of the second storage area; and a third control gate structure disposed on a surface of the third floating gate structure; and the fourth storage unit includes: a fourth floating gate structure disposed on a portion of the surface of the second storage area; and a fourth control gate structure disposed on a surface of the fourth floating gate structure.

Yet another embodiment of the present disclosure provides a method for driving a memory unit array, including: providing the memory unit array according to any one of claims 23 to 26; determining a memory unit to be operated; applying a first voltage to a source line coupled with a source region of the memory unit; and applying a second voltage to a bit line coupled with a first drain region and a second drain region of the memory unit.

In some embodiments, the method further includes: applying a third voltage to a first word line coupled with the first word line gate of the memory unit; applying a fourth voltage to a first control line coupled with the first storage unit of the memory unit; and applying a fifth voltage to a second control line coupled with the second storage unit of the memory unit.

In some embodiments, when performing a read operation, the first voltage is less than the second voltage, the fourth voltage is different from the fifth voltage, the third voltage is less than or equal to the fourth voltage, and the third voltage is less than or equal to the fifth voltage.

In some embodiments, when performing a write operation, the first voltage is different from the second voltage, and the fourth voltage is different from the fifth voltage, and the third voltage is less than the fourth voltage and the fifth voltage.

In some embodiments, when performing an erase operation, the first voltage and the second voltage are the same, the fourth voltage and the fifth voltage are the same, the third voltage is greater than the first voltage and the second voltage, and the fourth voltage and the fifth voltage are less than the first voltage and the second voltage.

In some embodiments, the method further includes: grounding a second word line coupled with the second word line gate of the memory unit; grounding a third control line coupled with the third storage unit of the memory unit; and grounding a fourth control line coupled with the fourth storage unit of the memory unit.

Compared with conventional technologies, embodiments of the present disclosure have following beneficial effects.

According to some embodiments of the present disclosure, since the substrate includes the first storage area and the second storage area which are close to and separated from each other, the source region is disposed in the substrate between the first storage area and the second storage area, and the first drain region and the second drain region are disposed in the substrate on both sides of the first storage area and the second storage area, so that the source region, the first drain region and the first storage structure form a pair of storage units, and the source region, the second drain region and the second storage structure form a pair of storage units. As a result, on the one hand, two pairs of storage units share the source region, which is beneficial to reduce a distance between the two pairs of storage units, so as to improve the density of the memory; on the other hand, it is beneficial to lead out the first and second drain regions through one bit line, and lead out the source region through the source line. Thus, with a reasonable arrangement of the memory, with only one metal pitch, the size of one active area cycle can be met, thereby improving the density of the memory.

In the memory unit array according to some embodiments of the present disclosure, since each active area includes a plurality of memory unit areas in the first direction, each memory unit area includes the first storage area and the second storage area which are close to and separated from each other, each source region is disposed in the substrate between the first storage area and the second storage area, each first drain region and each second drain region are respectively disposed in the substrate on both sides of the first storage area and the second storage area, so that the source region, the first drain region and the first storage structure form a pair of storage units, and the source region, the second drain region and the second storage structure form a pair of storage units. As a result, on the one hand, two pairs of storage units share the source region, which is beneficial to reduce a distance between the two pairs of storage units, so as to improve the density of the memory; on the other hand, it is beneficial to lead out the first and second drain regions through one bit line, and lead out the source region through the source line, and the bit line is perpendicular to the source line. Thus, with a reasonable arrangement, by arranging the metal lines in two directions, with only one metal cycle, the memory unit array can meet the size of one active area cycle, thereby improving the density of the memory unit array.

DETAILED DESCRIPTION

As mentioned in the background, the flash memory is poor in performance.

The cause of the problem will be described below with reference to the drawings.

Figure 1:
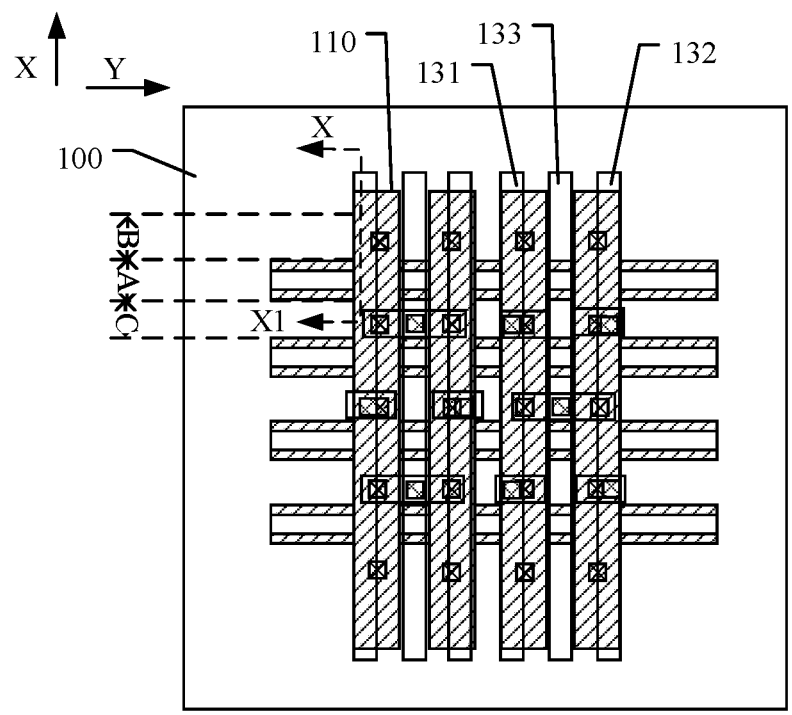
FIG. 1 shows a schematic view of a memory unit array.

FIG. 1 is a schematic view of a memory unit array.

Referring to FIG. 1, the memory unit array includes: a semiconductor substrate 100, wherein the semiconductor substrate 100 includes: a plurality of discrete active areas 110 disposed in parallel along a second direction Y, and an isolation structure (not shown in the figure) surrounding the active areas 110, the active areas 110 extend along a first direction X, each active area 110 includes a plurality of memory unit areas in the first direction X, and each memory unit area includes a storage area A, and a source area B and a drain area C on both sides of the storage area A; a plurality of source regions, wherein one source area B has one source region; a plurality of drain regions (not shown in the figure), wherein one drain area C has one drain region; a plurality of first bit lines 131 and a plurality of second bit lines 132 disposed in parallel, wherein the plurality of first bit lines 131 and the plurality of second bit lines 132 are respectively disposed on adjacent active areas 110, the plurality of first bit lines 131 are respectively electrically coupled with source regions in a same column, the plurality of second bit lines 132 are respectively electrically coupled with source regions in a same column, the plurality of first bit lines 131 extend in the first direction X, and the plurality of second bit lines 132 extend in the first direction X; and a plurality of third bit lines 133 disposed in parallel, wherein each third bit line 133 is disposed between adjacent first bit line 131 and second bit line 132, and each third bit line 133 is electrically coupled with two adjacent drain regions, and extend along the first direction X.

Figure 2:
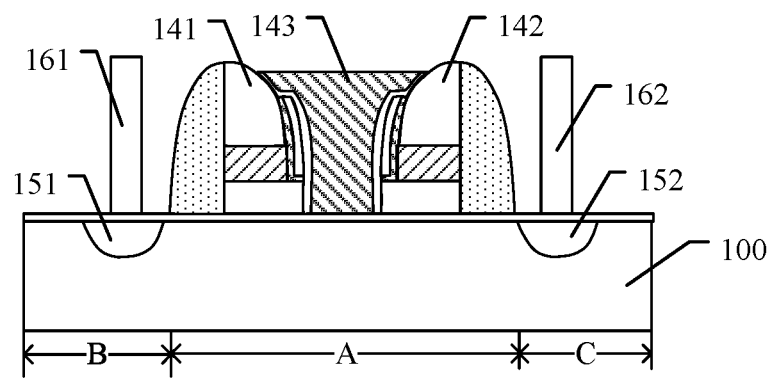
FIG. 2 shows a sectional view of a flash memory.

FIG. 2 is a sectional view of a flash memory, and FIG. 2 is a sectional view of FIG. 1 along line X-X1.

Referring to FIG. 2, the flash memory includes: a semiconductor substrate 100, wherein the semiconductor substrate 100 includes a storage area A, and a source area B and a drain area C on both sides of the storage area A, and the source area B and the drain area C are adjacent to the storage area A; a first storage unit 141 and a second storage unit 142 on the storage area A, and a word line gate 143 between the first storage unit 141 and the second storage unit 142; a source region 151 in the source area B; a drain region 152 in the drain area C; a first plug 161 disposed on the source region 151 and electrically coupled with the source region 151; and a second plug 162 disposed on the drain region 152 and electrically coupled with the drain region 152.

In the above-described memory unit array, among the adjacent memory units along the second direction Y, the first bit line 131 and the second bit line 132 need to be electrically coupled with the source regions 151 of two memory units respectively, and the third bit line 133 needs to be electrically coupled with the drain regions 152 of the two memory units. It can be seen that at present, three metal lines are needed for every two adjacent active areas, that is, the first bit line 131, the second bit line 132 and the third bit line 133 lead out the two memory units. Therefore, one active area cycle needs 1.5 metal line cycles. Due to the limitation of the existing lithography limit, the size of the metal line cycle can no longer be reduced, resulting the size of the active area cycle can no longer be reduced, so it is not beneficial to reduce the density of the memory unit array.

An embodiment of the present disclosure provides a method for forming a memory, including: providing a substrate including a first storage area and a second storage area which are close to and separated from each other; forming a first storage structure on the first storage area, wherein the first storage structure includes a first storage unit, a second storage unit, and a first word line gate between the first storage unit and the second storage unit; forming a second storage structure on the second storage area, wherein the second storage structure includes a third storage unit, a fourth storage unit, and a second word line gate between the third storage unit and the fourth storage unit; forming a source region in the substrate between the first storage area and the second storage area after forming the first storage structure and the second storage structure; and forming a first drain region and a second drain region in the substrate on both sides of the first storage area and the second storage area after forming the source region. The memory formed by the method can reduce the distance between two pairs of memory units, thereby increasing the density of the memory, and it is beneficial to the reasonable layout of the memory unit array, thereby increasing the density of the memory unit array.

In order to make above objects, features and beneficial effects of the present disclosure more obvious and understandable, specific embodiments of the present disclosure will be described in detail in combination with the attached drawings.

FIG. 3 to FIG. 17 are sectional views showing each step of a method for forming a memory according to an embodiment of the present disclosure.

Figure 3:
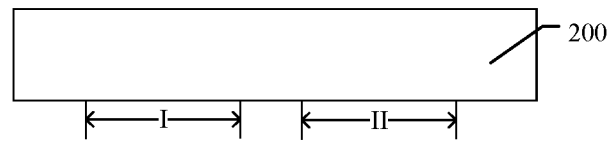
FIG. 3 to FIG. 17 are sectional views showing each step of a method for forming a memory according to an embodiment of the present disclosure.

Referring to FIG. 3, providing a substrate 200 including a first storage area I and a second storage area II which are close to and separated from each other.

In some embodiments, the material of the substrate 200 is silicon; in other embodiments, the material of the substrate may also be germanium, silicon germanium, silicon carbide, gallium arsenide, or indium gallium; and in other embodiments, the substrate may also be a silicon-on-insulator substrate or a germanium-on-insulator substrate.

Next, forming a first storage structure on the first storage area I, wherein the first storage structure includes a first storage unit, a second storage unit, and a first word line gate between the first storage unit and the second storage unit; forming a second storage structure II on the second storage area, wherein the second storage structure includes a third storage unit, a fourth storage unit, and a second word line gate between the third storage unit and the fourth storage unit.

In some embodiments, the first storage structure and the second storage structure are formed in a same process.

In some embodiments, forming the first storage structure further includes: forming first sidewalls on a top surface of the first storage unit and a top surface of the second storage unit, and forming the second storage structure further includes: forming second sidewalls on a top surface of the third storage unit and a top surface of the fourth storage unit.

Figure 4:
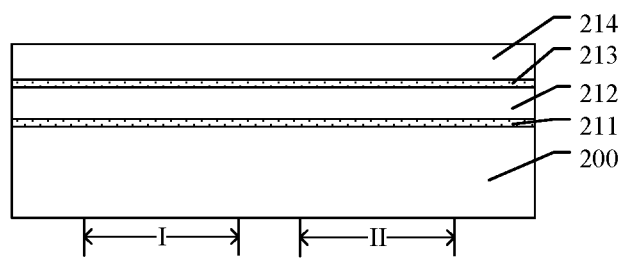

Referring to FIG. 4, forming a storage unit material film on a surface of the first storage area I and a surface of the second storage area II.

The storage unit material film provides materials for subsequent formation of the first storage structure and the second storage structure.

The storage unit material film includes: a floating gate dielectric film 211; a floating gate electrode film 212 on a surface of the floating gate dielectric film 211; a control gate dielectric film 213 on a surface of the floating gate electrode film 212; and a control gate electrode film 214 on a surface of the control gate dielectric film 213.

Specifically, in some embodiment, the floating gate dielectric film 211 is disposed on a portion of a surface of the substrate 200 on the first storage area I and the second storage area II, on a portion of the surface of the substrate 200 between the first storage area I and the second storage area II, and on a portion of the surface of the substrate 200 on both sides of the first storage area I and the second storage area II.

The floating gate dielectric film 211 may be made of a material including: silicon oxide, silicon nitride, silicon carbonitride, silicon boronnitride, silicon oxycarbonitride and silicon oxynitride. In some embodiments, the material of the floating gate dielectric film 211 is silicon oxide.

The floating gate electrode film 212 may be made of a material including: polysilicon or metal. In some embodiments, the material of the floating gate electrode film 212 is polysilicon.

The control gate dielectric film 213 may be made of a material including: silicon oxide, silicon nitride, silicon carbonitride, silicon boronnitride, silicon oxycarbonitride and silicon oxynitride. In some embodiment, the control gate dielectric film 213 has a three-layer structure of silicon oxide-silicon nitride-silicon oxide.

The control gate electrode film 214 may be made of a material including: polysilicon or metal. In some embodiment, the material of the control gate electrode film 214 is polysilicon.

Figure 5:
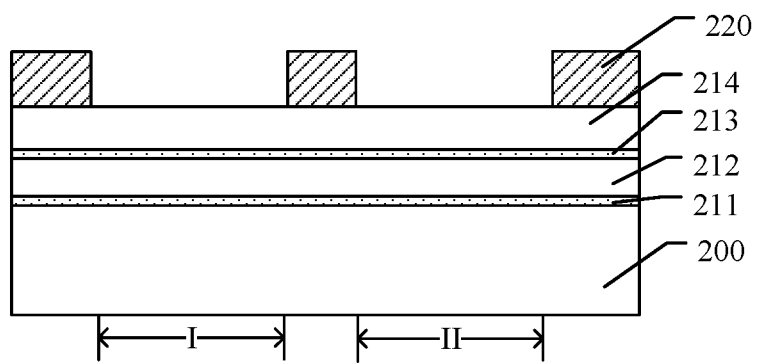

Referring to FIG. 5, forming a mask layer 220 on a surface of the storage unit material film. The mask layer 220 has a first groove (not shown in the figure) in the first storage area I, and a second groove (not shown in the figure) in the second storage area II.

The mask layer 220 is used to subsequently define positions of first sidewalls and second sidewalls on the one hand, and to subsequently provide a mask for forming the first storage structure and the second storage structure together with the first sidewalls and the second sidewalls on the other hand.

The mask layer 220 is made of a material including: silicon oxide, silicon nitride, silicon carbonitride, silicon boronnitride, silicon oxycarbonitride and silicon oxynitride. In some embodiments, the material of the mask layer 220 is silicon nitride.

The mask layer 220 having the first groove and the second groove may be formed using a photolithography process.

Figure 6:
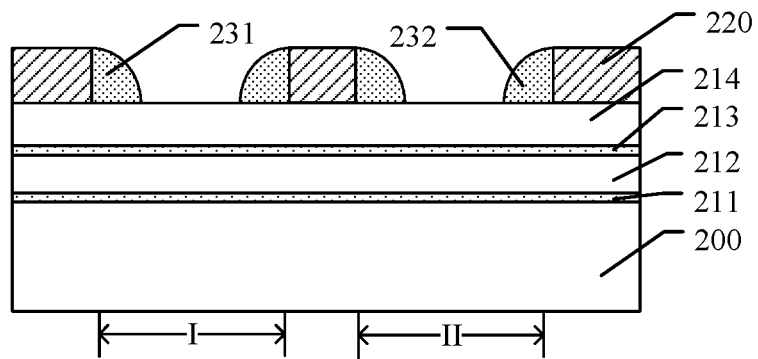

Referring to FIG. 6, the first sidewalls 231 are formed on sidewall surfaces of the first groove, the second sidewalls 232 are formed on sidewall surfaces of the second groove, and the first sidewalls 231 and the second sidewalls 232 are disposed on the surface of the storage unit material film.

The first sidewalls 231 and the second sidewalls 232 are used as a part of the first storage structure and the second storage structure respectively on the one hand, and as a mask together with the mask layer 220 for subsequently etching the storage unit material film.

The first sidewalls 231 and the second sidewalls 232 are made of a material different from the mask layer 220.

In some embodiments, the material of the first sidewalls 231 and the second sidewalls 232 is silicon oxide.

Forming the first sidewalls 231 and the second sidewalls 232 includes: forming a first sidewall material film (not shown) on the surface of the storage unit material film and a surface of the mask layer 220; and etching back the first sidewall material film until the surface of the storage unit material film is exposed, so as to form the first sidewalls 231 on the sidewall surfaces of the first groove, and form the second sidewalls on the sidewall surfaces of the second groove.

Next, etching the storage unit material film with the mask layer 220, the first sidewalls 231 and the second sidewalls 232 as a mask to form a first opening structure and a second opening structure in the storage unit material film, form the first storage unit and the second storage unit in the first storage area I, and form the third storage unit and the fourth storage unit in the second storage area II. The first opening structure is disposed between the first storage unit and the second storage unit, and the second opening structure is disposed between the third storage unit and the fourth storage unit.

Specifically, in some embodiments, the first opening structure includes: a first opening in the control gate electrode film 214 and the control gate dielectric film 213 on the first storage area I, and a third opening in the floating gate electrode film 212 and the floating gate dielectric film 211 on the first storage area I. The second opening structure includes: a second opening in the control gate electrode film 214 and the control gate dielectric film 213 on the second storage area II, and a fourth opening in the floating gate electrode film 212 and the floating gate dielectric film 211 on the second storage area II.

In some embodiments, the first opening and the second opening are formed simultaneously, and the third opening and the fourth opening are formed simultaneously. For the process of forming the first opening structure and the second opening structure, reference may be made to FIGS. 7 to 9.

Figure 7:
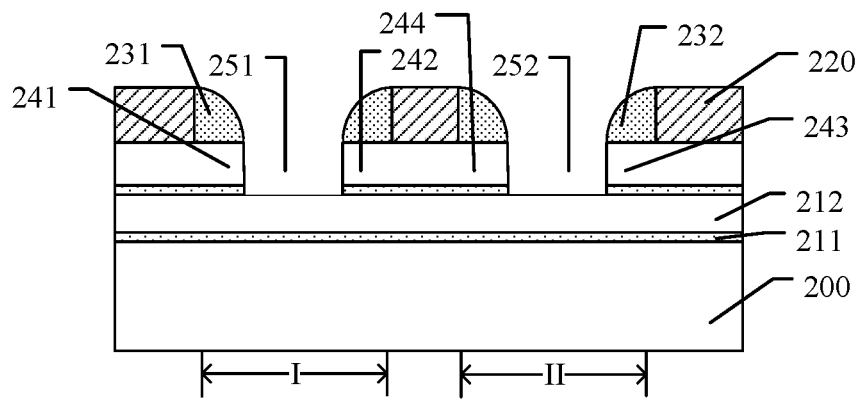

Referring to FIG. 7, using the mask layer 220, the first sidewalls 231, and the second sidewalls 232 as the mask, the control gate electrode film 214 and the control gate dielectric film 213 are etched until the surface of the floating gate electrode film 212 is exposed, so that a first control gate structure 241 and a second control gate structure 242 are formed on the first storage area I, a first opening 251 is formed between the first control gate structure 241 and the second control gate structure 242, a third control gate structure 243 and a fourth control gate structure 244 are formed on the second storage area II, and a second opening 252 is formed between the third control gate structure 243 and the fourth control gate structure 244.

The first opening 251 and a subsequently formed third opening together form the first opening structure for filling a material to form a first word line gate, and the second opening 252 and a subsequently formed fourth opening together form a second opening structure for filling a material to form a second word line gate.

The process of etching the control gate electrode film 214 and the control gate dielectric film 213 includes one or a combination of a wet etching process and a dry etching process.

In some embodiments, the process of etching the control gate electrode film 214 and the control gate dielectric film 213 is an anisotropic dry etching.

It should be noted that in some embodiments, the control gate electrode film 214 (shown in FIG. 6) and the control gate dielectric film 213 (shown in FIG. 6) on the substrate 200 on both sides of the first storage area I and the second storage area II, and on the substrate 200 between the first storage area I and the second storage area II will be removed subsequently, so that the first control gate structure 241 and the second control gate structure 242 formed finally are only disposed on the first storage area I, and the third control gate structure 243 and the fourth control gate structure 244 formed finally are only disposed on the second storage area II.

In some embodiments, after forming the first opening 251 and the second opening 252, and before subsequently forming the third opening and the fourth opening, the method for forming the memory further includes: forming a first isolation structure on a sidewall surface of the first opening 251, and forming a second isolation structure on a sidewall surface of the second opening 252. Specifically, for the process of forming the first isolation structure and the second isolation structure, reference may be made to FIGS. 8 to 9.

Figure 8:
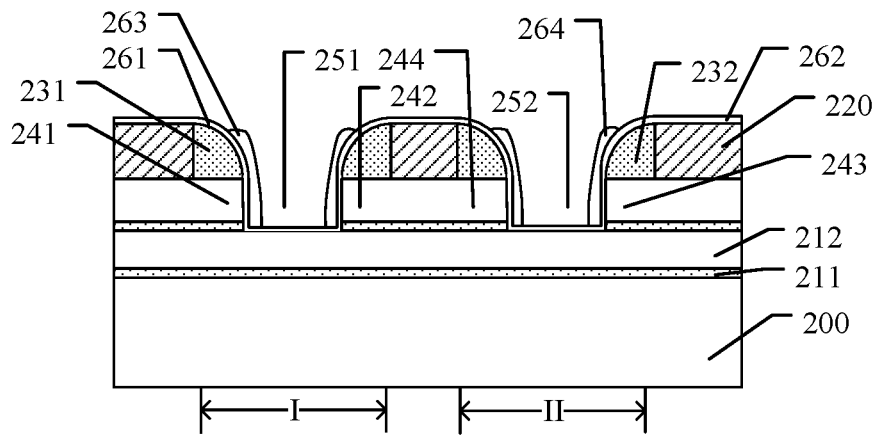

Referring to FIG. 8, after forming the first opening 251 and the second opening 252, forming a first isolation layer 261 on the surface of the mask layer 220, the surface of the first sidewall 231, and the sidewall surface of the first opening 251 on the first storage area 1, and forming a second isolation layer 262 on the surface of the mask layer 220, the sidewall surface of the second sidewall 232, and the sidewall surface of the second opening 252 on the second storage area II; forming a third isolation layer 263 on a surface of the first isolation layer 261 on the sidewall surface of the first opening 251; and forming a fourth isolation layer 264 on a surface of the second isolation layer 262 on the sidewall surface of the second opening 252.

The first isolation layer 261 and the third isolation layer 263 constitute the first isolation structure, and the second isolation layer 262 and the fourth isolation layer 264 constitute the second isolation structure.

The first isolation structure is used for isolating the first control gate structure and the first word line gate formed subsequently, and the second isolation structure is used for isolating the second control gate structure and the second word line gate formed subsequently.

Specifically, in some embodiments, the first isolation layer 261 is also located on a bottom surface of the first opening 251, and the second isolation layer 262 is also located on a bottom surface of the second opening 252, which will be removed by etching in subsequent process.

Figure 9:
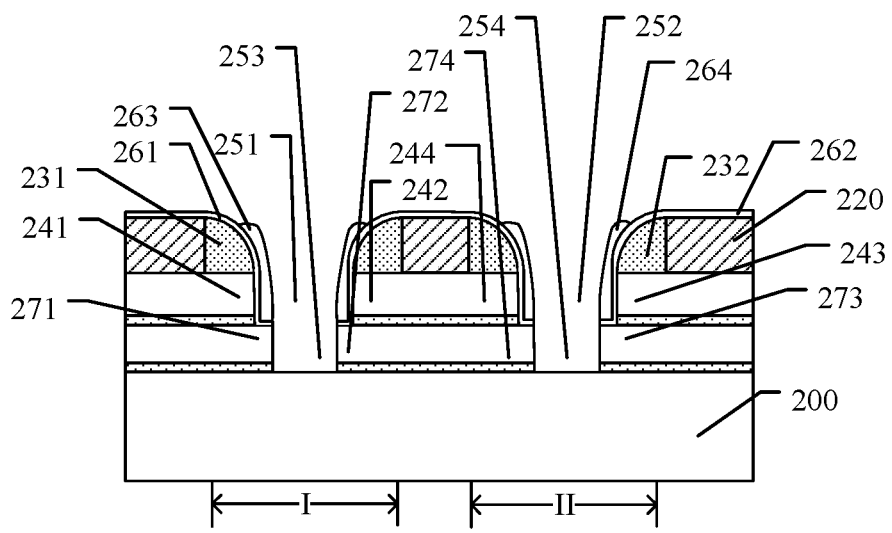

Referring to FIG. 9, after forming the first opening 251 and the second opening 252, the floating gate electrode film 212 and the floating gate dielectric film 211 are etched with the mask layer 220, the first sidewalls 231 and the second sidewalls 232 as a mask until the surface of the substrate 200 is exposed, so that a first floating gate structure 271, a second floating gate structure 272, and a third opening 253 between the first floating gate structure 271 and the second floating gate structure 272 are formed on the first storage area I, and a third floating gate structure 273 and a fourth floating gate structure 274, and a fourth opening 254 between the third floating gate structure 273 and the fourth floating gate structure 274 are formed on the second storage area II.

In some embodiments, with the mask layer 220, the first sidewalls 231, the second sidewalls 232, the first isolation layer 261, the second isolation layer 262, the third isolation layer 263 and the fourth isolation layer 264 as a mask, the floating gate electrode film 212 and the floating gate dielectric film 211 exposed by the first opening 251 and the second opening 252 are etched.

The third opening 253 is below the first opening 251, and the fourth opening 254 is below the second opening 252.

The first opening 251 and the third opening 253 form the first opening structure, and the second opening 252 and the fourth opening 254 form the second opening structure.

It should be noted that in some embodiments, the floating gate electrode film 212 and the floating gate dielectric film 211 on the substrate 200 on both sides of the first storage area I and the second storage area II, and on the substrate 200 between the first storage area I and the second storage area II will be removed subsequently, so that the first floating gate structure 271 and the second floating gate structure 272 formed finally are only located on the first storage area I, and the third floating gate structure 273 and the fourth floating gate structure 274 formed finally are only located on the second storage area II.

So far, the first floating gate structure 271 on the surface of the first storage area I and the first control gate structure 241 on a surface of the first floating gate structure 271 constitute the first storage unit (not shown in the figure); the second floating gate structure 272 on the surface of the first storage area I and the second control gate structure 242 on a surface of the second floating gate structure 272 constitute the second storage unit (not shown in the figure); the third floating gate structure 273 on the surface of the second storage area II and the third control gate structure 243 on a surface of the third floating gate structure 273 constitute the third storage unit (not shown in the figure); and the fourth floating gate structure 274 on the surface of the second storage area II and the fourth control gate structure 244 on a surface of the fourth floating gate structure 274 constitute the fourth storage unit (not shown in the figure).

The first storage unit is close to the first drain region formed subsequently, and the second storage unit is close to the source region formed subsequently.

The third storage unit is close to the second drain region formed subsequently, and the fourth storage unit is close to the source region formed subsequently.

It should be noted that since the storage unit material film is also located on the substrate 200 between the first storage area I and the second storage area II, the mask layer 220 covers the storage unit material film between the first storage area I and the second storage areas II. Etching the storage unit material film using the mask layer 220, the first sidewalls 231 and the second sidewalls 232 as the mask further includes: forming a sacrificial storage unit (not shown in the figure) on the substrate 200 between the first storage area I and the second storage area II. The sacrificial storage unit is disposed between the second storage unit and the fourth storage unit, and will be removed subsequently to form a third opening structure between the second storage unit and the fourth storage unit.

Figure 10:
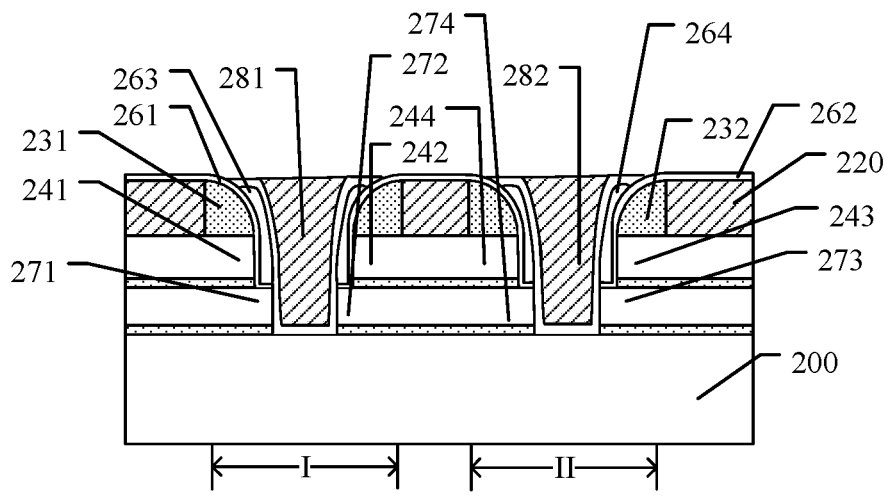

Referring to FIG. 10, after forming the first opening structure and the second opening structure, a first word line gate 281 is formed in the first opening structure, and a second word line gate 282 is formed in the second opening structure.

The process of forming the first word line gate 281 and the second word line gate 282 includes: forming a word line dielectric film (not shown in the figure) on surfaces of a bottom and sidewalls of the first opening structure and the second opening structure, and on surfaces of the first isolation structure and the second isolation structure; and forming a word line electrode film (not shown in the figure) on a surface of the word line dielectric film for filling the first opening structure and the second opening structure; planarizing the word line electrode film and the word line dielectric film until the first isolation structure and the second isolation structure are exposed, so that the first word line gate 281 is formed in the first opening structure, and the second word line gate 282 is formed in the second opening structure.

The first word line gate 281 is located between the first storage unit and the second storage unit, and the second word line gate 282 is located between the third storage unit and the fourth storage unit.

So far, the first storage structure includes: the first storage unit and the second storage unit on the first memory area I, and the first word line gate 281. The second storage structure includes: the third storage unit and the fourth storage unit on the second storage area II, and the second word line gate 282.

Next, the sacrificial storage unit and the mask layer 220 on a surface of the sacrificial storage unit are removed until the surface of the substrate 200 is exposed to form the third opening structure, and the sidewall surfaces of the first sidewalls 231, the second sidewalls 232, the second storage unit, and the fourth storage unit are exposed by the third opening structure. For the process of forming the third opening structure, reference may be made to FIGS. 11 to 12.

Figure 11:
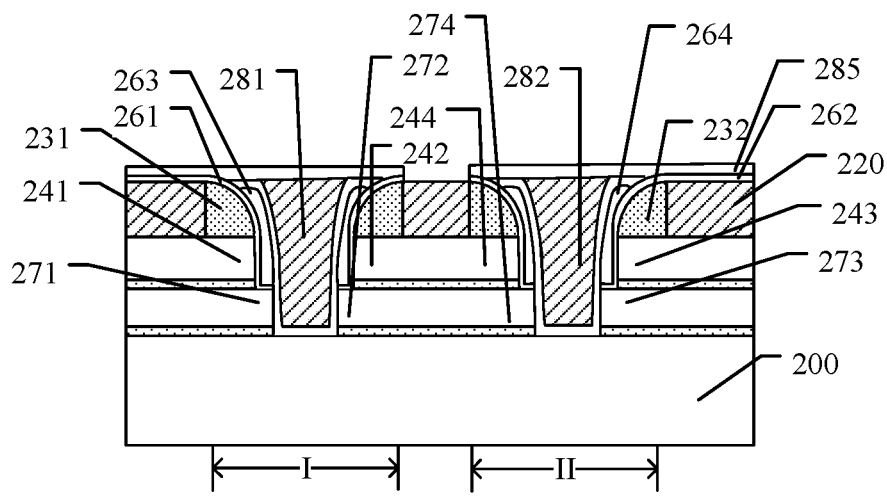

Referring to FIG. 11, a patterned layer 285 is formed on a surface of the first word line gate 281 and a surface of the second word line gate 282, and on surfaces of the first isolation structure and the second isolation structure. The surface of the mask layer 220 on the substrate 200 between the first storage area I and the second storage area II is exposed by the patterned layer 285.

The patterned layer 285 and the mask layer 220 are made of different materials.

The material of the patterned layer 285 includes a hard mask material or a photoresist.

In some embodiments, the material of the patterned layer 285 is silicon oxide.

Figure 12:
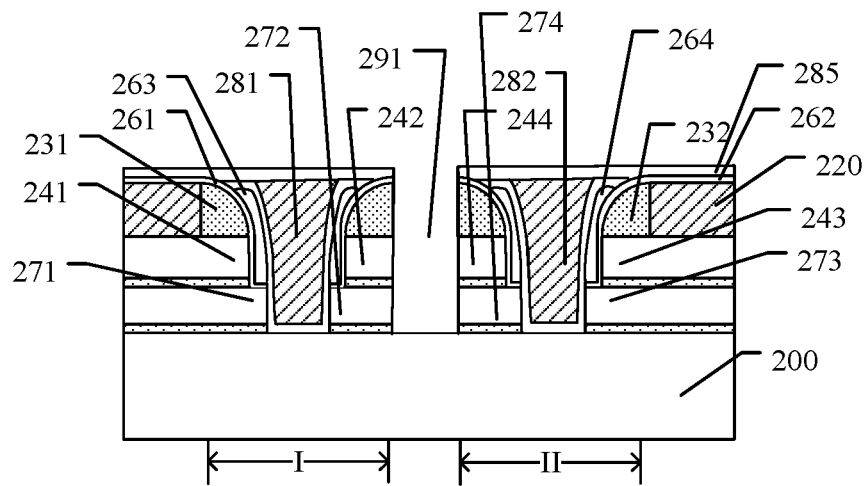

Referring to FIG. 12, using the patterned layer 285 as a mask, the mask layer 220 and the sacrificial storage unit at the bottom of the mask layer 220 are etched until the surface of the substrate 200 is exposed to form the third opening structure 291.

The third opening structure 291 provides space for the subsequent formation of the source line.

The process of etching the mask layer 220 and the sacrificial storage unit at the bottom of the mask layer 220 includes one or a combination of a wet etching process and a dry etching process.

The third opening structure 291 is disposed between the first storage structure and the second storage structure.

Figure 13:
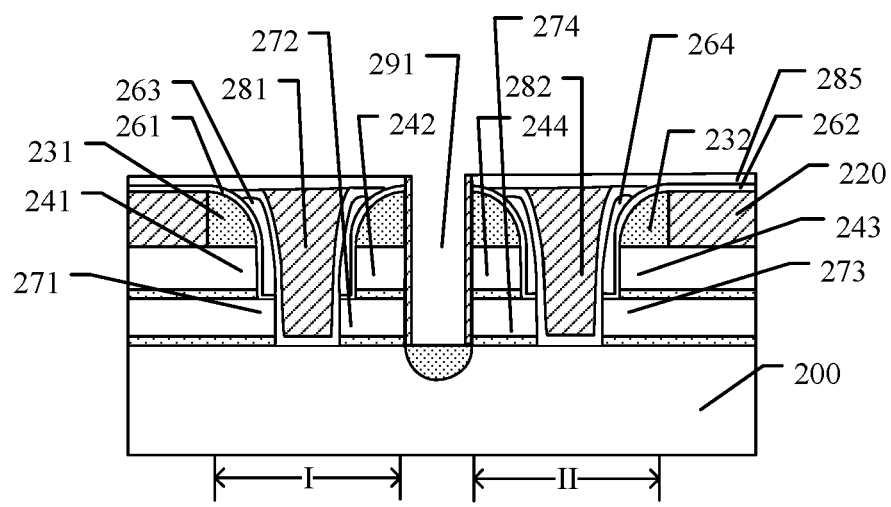

Referring to FIG. 13, after forming the third opening structure 291, an ion doping process is performed on the substrate 200 between the first storage area I and the second storage area II to form the source region (not showing in the figure).

In some embodiments, after forming the third opening structure 291 and before forming the source region, the method further includes: forming a fifth sidewall (not shown in the figure) on a sidewall surface of the third opening structure 291).

The process of forming the source region includes: using the patterned layer 285 and the fifth sidewall as a mask, an ion doping process is performed on the substrate 200 exposed at the bottom of the third opening structure 291 to form the source region (not showing in the figure).

The function of the fifth sidewall is that, on the one hand, it protects the sidewalls of the second storage unit and the fourth storage unit from being affected by ion doping; on the other hand, it isolates the second storage unit from the source line formed subsequently, and isolates the fourth storage unit from the source line subsequently.

The process of forming the fifth sidewall includes: forming a second sidewall material film on the bottom and sidewall surfaces of the third opening structure, and on the surfaces of the first isolation structure and the second isolation structure (not shown in the figure); and etching back the second sidewall material film until the surface of the substrate 200 is exposed, so that the fifth sidewall is formed on the sidewall surface of the third opening structure.

The fifth sidewall may be made of a material including: silicon oxide, silicon nitride, silicon carbonitride, silicon boronnitride, silicon oxycarbonitride and silicon oxynitride. In some embodiments, the material of the fifth sidewall is silicon oxide.

Figure 14:
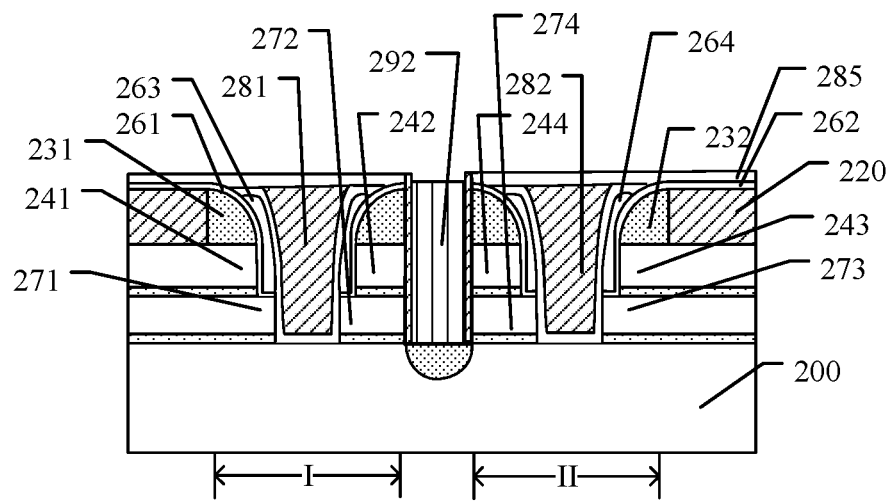

Referring to FIG. 14, after the source region is formed, a source line 292 is formed in the third opening structure 291, and the source line 292 is located between the first storage structure and the second storage structure.

The process of forming the source line 292 includes: forming a source line material film (not shown in the figure) on surfaces of the third opening structure 291 and the patterned layer 285; and planarizing the source line material film until the surface of the patterned layer 285 is exposed to form the source line 292.

The source line 292 is made of a material including polysilicon and metal. In some embodiments, the material of the source line 292 is polysilicon.

In some embodiments, after forming the source line 292, the method also includes: removing the patterned layer 285.

Figure 15:
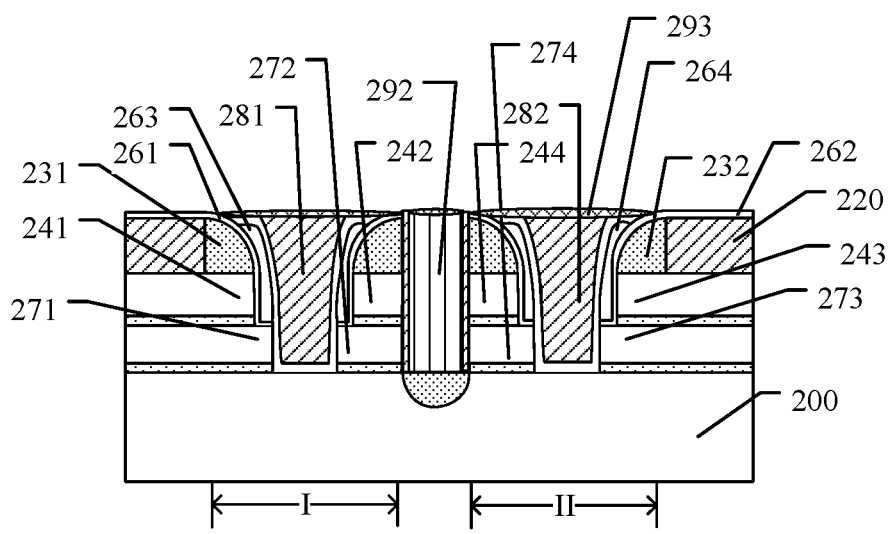

Referring to FIG. 15, after forming the source line 292, a protective layer 293 is formed on surfaces of the first word gate line 281, the second word line gate 282 and the source line 292.

The protective layer 293 is used to protect the surfaces of the first word line gate 281, the second word line gate 282 and the source line 292 from being damaged in subsequent etching process.

In some embodiments, the protective layer 293 is formed by a thermal oxidation process, and the material of the protective layer 293 is silicon oxide.

After forming the source line 292 and the protective layer 293, the first drain region and the second drain region are formed in the substrate 200 on both sides of the first storage area I and the second storage area II.

In some embodiments, the remaining storage unit material film 220 (shown in FIG. 6) on both sides of the first storage area I and the second storage area II and the mask layer 220 on the surface of the storage unit material film need to be removed to expose the surface of the substrate 200 on both sides of the first storage area I and the second storage area II. For the process of forming the first drain region and the second drain region, reference may be made to FIGS. 16-17.

Figure 16:
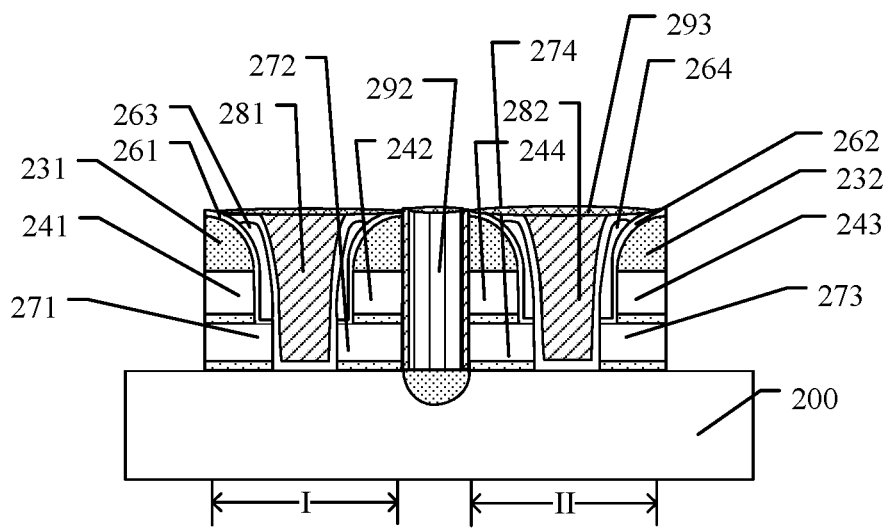

Referring to FIG. 16, after forming the protective layer 293, the storage unit material film (shown in FIG. 6) on the substrate 200 on both sides of the first storage area I and the second storage area II and the mask layer 220 on the surface of the storage unit material film are removed to expose the surface of the substrate 200.

The protective layer 293 can protect the surfaces of the first word line gate 281, the second word line gate 282 and the source line 292 in the process of etching the mask layer 220 and the storage unit material film.

Figure 17:
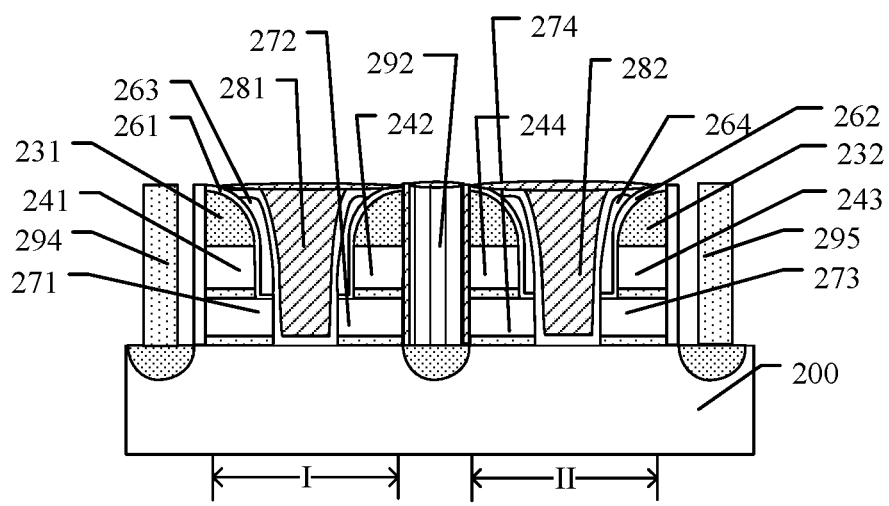

Referring to FIG. 17, an ion doping process is performed on the substrate 200 to form the first drain region (not shown in the figure) and the second drain region (not shown in the figure) in the substrate 200 on both sides of the first storage area I and the second storage area II.

Specifically, using the protective layer 293 as a mask, an ion doping process is performed on the exposed substrate 200 to form the first drain region and the second drain region.

In some embodiment, after the surface of the substrate 200 on both sides of the first storage area I and the second storage area II are exposed, and before the first drain region and the second drain region are formed, the method further includes: forming a third sidewall (not shown in the figure) on sidewall surfaces of the first storage unit and the first sidewalls 231, and forming a fourth sidewall (not shown in the figure) on sidewall surfaces of the third storage unit and the second sidewalls 232.

On the one hand, the third sidewall constitutes the first storage structure, and the fourth sidewall constitutes the second storage structure, providing an isolation effect; on the other hand, the third sidewall and the fourth sidewall protect the sidewalls of the first storage unit and the third storage unit from being affected by ion doping.

The third sidewall and the fourth sidewall may be made of a material including: silicon oxide, silicon nitride, silicon carbonitride, silicon boronnitride, silicon oxycarbonitride and silicon oxynitride. In some embodiment, the third sidewall and the fourth sidewall have a three-layer structure of silicon oxide-silicon nitride-silicon oxide.

So far, the first storage structure is finally formed on the first storage area I, and the first storage structure includes: the first storage unit and the second storage unit, the first word line gate 281 between the first storage unit and the second storage unit, the first sidewalls 231 respectively formed on the top surfaces of the first storage unit and the second storage unit, and the third sidewall on the sidewall surfaces of the first storage unit and the first sidewalls 231 close to the first drain region. The second storage structure is finally formed on the second storage area II, and the second storage structure includes: the third storage unit and the fourth storage unit, the second word line gate 282 between the third storage unit and the fourth storage unit, the second sidewalls 232 respectively formed on the top surfaces of the third storage unit and the fourth storage unit, and the fourth sidewall on the sidewall surfaces of the third storage unit and the second sidewalls 232 close to the second drain region.

In some embodiment, after the third side wall and the fourth side wall are formed, and before the first plug and the second plug are formed subsequently, the method for forming the memory further includes: removing the protective layer 293; and forming a contact resistance layer (not shown in the figure) on the surfaces of the first word line gate 281, the second word line gate 282, and the source line 292.

Still referring to FIG. 17, after forming the first drain region, a first plug 294 is formed on the first drain region, and the first plug 294 is electrically coupled with the first drain region. After forming the second drain region, a second plug 295 is formed on the second drain region, and the second plug 295 is electrically coupled with the second drain region.

The first plug 294 is used to electrically connect the first drain region to a peripheral circuit, and the second plug 295 is used to electrically connect the second drain region to the peripheral circuit.

Correspondingly, another embodiment of the present disclosure provides a memory formed by the above method. Still referring to FIG. 17, the memory includes: a substrate 200 including a first storage area I and a second storage area II which are close to and separated from each other; a source area (not shown in the figure) disposed in the substrate 200 between the first storage area I and the second storage area II; a first drain region (not shown in the figure) and a second drain region (not shown in the figure) disposed in the substrate 200 on both sides of the first storage area I and the second storage area II; a first storage structure disposed on the first storage area I, wherein the first storage structure includes a first storage unit, a second storage unit, and a first word line gate 281 between the first storage unit and the second storage unit; and a second storage structure disposed on the second storage area II, wherein the second storage structure includes a third storage unit, a fourth storage unit, and a second word line gate 282 between the third storage unit and the fourth storage unit.

Specific embodiments will be described in detail below in combination with the attached drawings.

The memory further includes a source line 292 disposed on the source region between the first storage structure and the second storage structure, and the source line 292 is electrically coupled with the source region.

The memory further includes: a first plug 294 disposed on the first drain region and electrically coupled with the first drain region, and a second plug 295 disposed on the second drain region and electrically coupled with the second drain region.

The first storage unit is close to the first drain region and the second storage unit is close to the source region.

The third storage unit is close to the second drain region and the fourth storage unit is close to the source region.

The first storage unit includes a first floating gate structure 271 disposed on a portion of a surface of the first storage area I, and a first control gate structure 241 disposed on a surface of the first floating gate structure 271. The second storage unit includes a second floating gate structure 272 disposed on a portion of the surface of the first storage area I, and a second control gate structure 242 disposed on a surface of the second floating gate structure 272.

The third storage unit includes a third floating gate structure 273 disposed on a portion of a surface of the second storage area II, and a third control gate structure 243 disposed on a surface of the third floating gate structure 273. The fourth storage unit includes a fourth floating gate structure 274 disposed on a portion of the surface of the second storage area, and a fourth control gate structure 244 disposed on a surface of the fourth floating gate structure 274.

The first storage structure further includes first sidewalls 231 respectively disposed on a top surface of the first control gate structure 241 and a top surface of the second control gate structure 242, and the second storage structure further includes second sidewalls 232 respectively disposed on a top surface of the third control gate structure 243 and a top surface of the fourth control gate structure 244.

The first storage structure further includes a third sidewall (not shown in the figure) disposed on sidewall surfaces of the first storage unit and the first sidewalls 231 close to the first drain region, and the second storage structure further includes a fourth sidewall (not shown in the figure) disposed on sidewall surfaces of the third storage unit and the second sidewalls 232 close to the second drain region.

The memory further includes fifth sidewalls respectively disposed on sidewall surfaces of both sides of the source line 292. The fifth sidewalls are respectively disposed between the source line 292 and the second storage unit and between the source line 292 and the fourth storage unit.

Since the substrate 200 includes the first storage area I and the second storage area II which are close to and separated from each other, the source region is disposed in the substrate between the first storage area I and the second storage area II, and the first drain region and the second drain region are disposed in the substrate 200 on both sides of the first storage area and the second storage area, so that the source region, the first drain region and the first storage structure form a pair of storage units, and the source region, the second drain region and the second storage structure form a pair of storage units. As a result, on the one hand, two pairs of storage units share the source region, which is beneficial to reduce a distance between the two pairs of storage units, so as to improve the density of the memory; on the other hand, it is beneficial to lead out the first and second drain regions through the bit line, and lead out the source region through the source line 292. Thus, with a reasonable arrangement of the memory, with only one metal pitch, the size of one active area cycle can be met, thereby improving the density of the memory.

Figure 18:
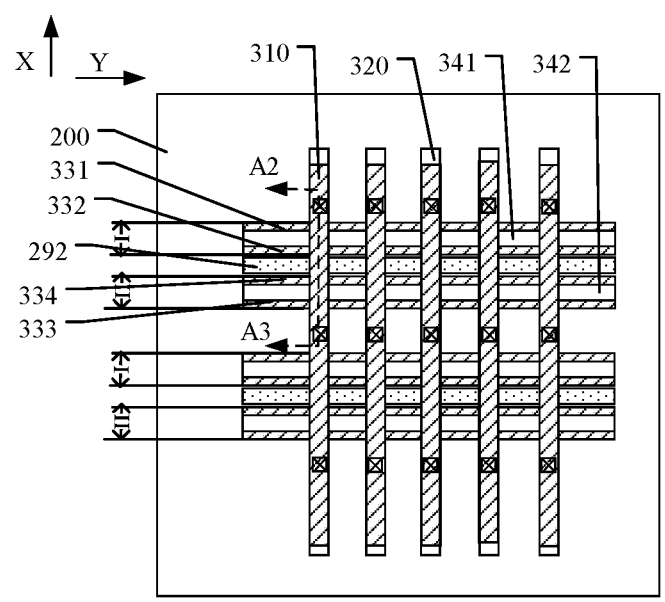
FIG. 18 shows a schematic view of a memory unit array according to an embodiment of the present disclosure.

FIG. 18 is a schematic view of a memory unit array according to an embodiment of the present disclosure.

Correspondingly, another embodiment of the present disclosure provides a memory unit array. Referring to FIGS. 17 and 18, the memory unit array. includes: a substrate 200, wherein the substrate 200 includes a plurality of discrete active areas 310 disposed in parallel along a second direction Y, and an isolation structure (not shown in the figure) surrounding the plurality of discrete active areas 310, the plurality of discrete active areas 310 extend along a first direction X, each active area 310 includes a plurality of memory unit areas in the first direction X, and each memory unit area includes a first storage area I and a second storage area II which are close to and separated from each other; a plurality of first drain regions (not shown in the figure) and a plurality of second drain regions (not shown in the figure), wherein each first drain region and each second drain region are respectively disposed in the substrate on both sides of the first storage area I and the second storage area II; a plurality of source regions (not shown in the figure), wherein each source region is disposed in the substrate 200 between the first storage area I and the second storage area II; a plurality of first storage structures (not shown in the figure), wherein each first storage structure is disposed on each first storage area I, and each first storage structure includes a first storage unit, a second storage unit, and a first word line gate (not shown in the figure) between the first storage unit and the second storage unit; a plurality of second storage structures, wherein each second storage structure is disposed on each second storage area, and each second storage structure includes a third storage unit, a fourth storage unit, and a second word line gate (not shown in the figure) between the third storage unit and the fourth storage unit; a plurality of source lines 292 disposed in parallel along the first direction, wherein each source line is electrically coupled with each source region; and a plurality of bit lines 320 disposed in parallel along the second direction Y, wherein each bit line 320 is electrically coupled with the first drain region and the second drain region in a same column.

It should be noted that FIG. 17 is a sectional view of FIG. 18 along line A2-A3.

The memory unit array further includes: a plurality of first control lines 331 disposed in parallel along the first direction X, wherein each of the plurality of first control lines 331 is electrically coupled with the first storage unit in a same row; a plurality of second control lines 332 disposed in parallel along the first direction X, wherein each of the plurality of second control lines 332 is electrically coupled with the second storage unit in a same row; a plurality of third control lines 333 disposed in parallel along the first direction X, wherein each of the plurality of third control line 333 is electrically coupled with the third storage unit in a same row; a plurality of fourth control lines 334 disposed in parallel along the first direction X, wherein each of the plurality of fourth control lines 334 is electrically coupled with the fourth storage unit in a same row; a plurality of first word lines 341 disposed in parallel along the first direction X, wherein each of the plurality of first word line 341 is electrically coupled with the first word line gate in a same row; and a plurality of second word lines 342 disposed in parallel along the first direction X, wherein each of the plurality of second word line 342 is electrically coupled with the second word line gate in a same row.

In some embodiments, adjacent memory unit areas share the first drain region or the second drain region along the first direction X.

It should be noted that the column refers to the first direction X, and the row refers to the second direction Y.

Specifically, the first storage unit includes a first floating gate structure 271 disposed on a portion of a surface of the first storage area I, and a first control gate structure 241 disposed on a surface of the first floating gate structure 271. The second storage unit includes a second floating gate structure 272 disposed on a portion of the surface of the first storage area, and a second control gate structure 242 disposed on a surface of the second floating gate structure 272. The third storage unit includes a third floating gate structure 273 disposed on a portion of a surface of the second storage area II, and a third control gate structure 243 disposed on a surface of the third floating gate structure 273. The fourth storage unit includes a fourth floating gate structure 274 disposed on a portion of the surface of the second storage area II, and a fourth control gate structure 244 disposed on a surface of the fourth floating gate structure 274.

Since each active area 310 includes a plurality of memory unit areas in the first direction X, each memory unit area includes the first storage area I and the second storage area II which are close to and separated from each other, each source region is disposed in the substrate 200 between the first storage area I and the second storage area II, each first drain region and each second drain region are respectively disposed in the substrate 200 on both sides of the first storage area I and the second storage area II, so that the source region, the first drain region and the first storage structure form a pair of storage units, and the source region, the second drain region and the second storage structure form a pair of storage units. As a result, on the one hand, two pairs of storage units share the source region, which is beneficial to reduce a distance between the two pairs of storage units, so as to improve the density of the memory; on the other hand, it is beneficial to lead out the first and second drain regions through the bit line 320, and lead out the source region through the source line, and the bit line is perpendicular to the source line. Thus, with a reasonable arrangement, by arranging the metal lines in two directions, only one metal cycle is needed in order to enable the memory unit array to meet the size of one active area cycle, thereby improving the density of the memory unit array.

Correspondingly, another embodiment of the present disclosure provides a method for driving a memory unit array. Still referring to FIG. 18, the method includes: providing the memory unit array according to some embodiments of the present disclosure; determining a memory unit to be operated; applying a first voltage to the source line 292 coupled with a source region of the memory unit; and applying a second voltage to the bit line 320 coupled with a first drain region and a second drain region of the memory unit.

The method for driving the memory unit further includes: applying a third voltage to the first word line 341 coupled with the first word line gate of the memory unit; applying a fourth voltage to the first control line 331 coupled with the first storage unit of the memory unit; and applying a fifth voltage to a second control line 332 coupled with the second storage unit of the memory unit.

Specific embodiments will be described in detail below in combination with FIGS. 17 and 18.

When performing a read operation, the first voltage is less than the second voltage, the fourth voltage is different from the fifth voltage, the third voltage is less than or equal to the fourth voltage, and the third voltage is less than or equal to the fifth voltage.

Specifically, the first voltage ranges from 0V to 0.5V, the second voltage ranges from 0.5V to 1.2V, the third voltage ranges from 3V to 5V, the fourth voltage ranges from 0V to 6V, and the fifth voltage ranges from 0V to 6V.

Specifically, when performing a read operation for the first storage unit, the fourth voltage is less than the fifth voltage; and when performing a read operation for the second storage unit, the fourth voltage is greater than the fifth voltage.

In some embodiment, the first voltage is 0V, the second voltage is 0.8V, the third voltage is 4.5V, the fourth voltage is 0V, and the fifth voltage is 4.5V. In the case of applying voltage, the third voltage is a positive voltage, which enables to form an inversion layer in the substrate 200 at a bottom of the first word line gate. At the same time, the fifth voltage is relative high, which also enables to form an inversion layer in the substrate 200 at a bottom of the second storage unit. Therefore, whether the source region and the first drain region are conducted with each other to generate a current depends on the first floating gate structure 271, thereby enabling to read information in the first floating gate structure 271 in the first storage unit.

In another embodiment, the first voltage is 0V, the second voltage is 0.8V, the third voltage is 4.5V, the fourth voltage is 4.5V and the fifth voltage is 0V. In the case of applying voltage, information in the second floating gate structure 272 in the second storage unit can be read.

At the same time, the method for driving the memory unit array further includes: grounding the second word line 342 coupled with the second word line gate of the memory unit; grounding the third control line 333 coupled with the third storage unit of the memory unit; and grounding the fourth control line 334 coupled with the fourth storage unit of the memory unit. Since the second word line 342 is grounded, a channel at the bottom of the second word line gate in the memory unit to be operated cannot be turned on, so that the third storage unit and the fourth storage unit cannot be read.

When performing a write operation, the first voltage is different from the second voltage, and the fourth voltage is different from the fifth voltage, and the third voltage is less than the fourth voltage and the fifth voltage.

Specifically, the first voltage ranges from 0V to 7V, the second voltage ranges from 0V to 7V, the third voltage ranges from 0.5V to 2V, the fourth voltage ranges from 4V to 10V, and the fifth voltage ranges from 4V to 10V.

Specifically, when performing a write operation for the first storage unit, the second voltage is greater than the first voltage, and the fourth voltage is greater than the fifth voltage; and when performing a write operation for the second storage unit, the second voltage is less than the first voltage, and the fourth voltage is less than the fifth voltage.

In some embodiments, the first voltage is 0V, the second voltage is 5.5V, the third voltage is 1.5V, the fourth voltage is 8V, and the fifth voltage is 5V. In the case of applying voltage, the third voltage is a positive voltage, which enables to form an inversion layer in the substrate 200 at the bottom of the first word line gate. The fourth voltage is a positive voltage, which enables to form an inversion layer in the substrate 200 at the bottom of the first storage unit, while the fifth voltage is a positive voltage, which also enables to form an inversion layer in the substrate 200 at the bottom of the second storage unit, so that the source region and the first drain region are conducted with each other to generate a current. Moreover, the second voltage is far greater than the first voltage, so that carriers in the channel have large kinetic energy, so that a certain number of hot carriers are tunneling into the first floating gate structure 271 in the first storage unit, thereby completing the write operation.

In another embodiment, the first voltage is 5.5V, the second voltage is 0V, the third voltage is 1.5V, the fourth voltage is 5V, and the fifth voltage is 8V. In the case of applying voltage, a certain number of hot carriers can be tunneling into the second floating gate structure 272 in the second storage unit, thereby completing the write operation.

At the same time, the method for driving the memory unit array further includes: connecting the second word line 342 coupled with the second word line gate of the memory unit to ground; connecting the third control line 333 coupled with the third storage unit to ground; and connecting the fourth control line 334 coupled with the fourth storage unit of the memory unit to ground. Since the second word line 342, the third control line 333, and the fourth control line 334 are grounded, the channel at the bottom of the second word gate in the memory unit to be operated cannot be turned on, so that the third storage unit and the fourth storage unit cannot be written.

When performing an erase operation, the first voltage and the second voltage are the same, the fourth voltage and the fifth voltage are the same, the third voltage is greater than the first voltage and the second voltage, and the fourth voltage and the fifth voltage are less than the first voltage and the second voltage.

Specifically, the first voltage ranges from 0V to 0.5V, the second voltage ranges from 0V to 0.5V, the third voltage ranges from 8V to 12V, the fourth voltage ranges from −5V to −10V, and the fifth voltage ranges from −5V to −10V.

In some embodiments, the first voltage is 0V, the second voltage is 0V, the third voltage is 8.5V, the fourth voltage is −7V, and the fifth voltage is −7V. In the case of applying voltage, the third voltage is high enough to enable electrons in the first floating gate structure 271 and the second floating gate structure 272 on both sides of the first word line gate 281 to tunnel into the first word line gate 281. At the same time, the fourth voltage and the fifth voltage are both negative voltage, which repels the electrons in the first floating gate structure 271 and the second floating gate structure 272, so as to further help the electrons in the first floating gate structure 271 and the second floating gate structure 272 to tunnel into the first word line gate 281, thereby completing the erase operation for the first storage unit and the second storage unit at the same time.

Meanwhile, the method for diving the memory unit array further includes: connecting the second word line 342 coupled with the second word line gate of the memory unit to ground; connecting the third control line 333 coupled with the third storage unit of the memory unit to ground; and connecting the fourth control line 334 coupled with the fourth storage unit of the memory unit to ground. Because the second word line 342, the third control line 333 and the fourth control line 334 are grounded, there is no voltage difference between the third floating gate structure 273 and the second word line gate 282, and between the fourth floating gate structure 274 and the second word line gate 282 in the memory unit to be operated, so that the third storage unit and the fourth storage unit cannot be erased.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A memory, comprising:
   a substrate, comprising a first storage area and a second storage area which are close to and separated from each other;
   a source region, disposed in the substrate between the first storage area and the second storage area;
   a first drain region and a second drain region, disposed in the substrate on both sides of the first storage area and the second storage area;
   a first storage structure, disposed on the first storage area, wherein the first storage structure comprises a first storage unit, a second storage unit, and a first word line gate between the first storage unit and the second storage unit; and
   a second storage structure, disposed on the second storage area, wherein the second storage structure comprises a third storage unit, a fourth storage unit, and a second word line gate between the third storage unit and the fourth storage unit,
   a bit line coupled with the first drain region and the second drain region;
   wherein the source region, the first drain region and the first storage structure form the first storage unit and the second storage unit, and the source region, the second drain region and the second storage structure form the third storage unit and the fourth storage unit.

2. The memory according to claim 1, further comprising:
   a source line, disposed on the source region between the first storage structure and the second storage structure and electrically coupled with the source region.

3. The memory according to claim 1, further comprising:
   a first plug, disposed on the first drain region and electrically coupled with the first drain region; and
   a second plug, disposed on the second drain region and electrically coupled with the second drain region.

4. The memory according to claim 1, wherein the first storage unit is close to the first drain region, the second storage unit is close to the source region, the third storage unit is close to the second drain region, and the fourth storage unit is close to the source region.

5. The memory according to claim 1, wherein the first storage unit comprises:
   a first floating gate structure, disposed on a portion of a surface of the first storage area; and
   a first control gate structure disposed on a surface of the first floating gate structure;
   wherein the second storage unit comprises:
   a second floating gate structure, disposed on a portion of the surface of the first storage area; and
   a second control gate structure, disposed on a surface of the second floating gate structure;
   wherein the third storage unit comprises:
   a third floating gate structure, disposed on a portion of a surface of the second storage area; and
   a third control gate structure, disposed on a surface of the third floating gate structure;
   wherein the fourth storage unit comprises:
   a fourth floating gate structure, disposed on a portion of the surface of the second storage area; and
   a fourth control gate structure, disposed on a surface of the fourth floating gate structure.

6. The memory according to claim 1, wherein the first storage structure further comprises:
   a first sidewall, disposed on a top surface of the first control gate structure and a top surface of the second control gate structure;
   wherein the second storage structure further comprises:
   a second sidewall, disposed on a top surface of the third control gate structure and a top surface of the fourth control gate structure.

7. The memory according to claim 1, wherein the first storage structure further comprises:
   a third sidewall, disposed on sidewall surfaces of the first storage unit and the first sidewalls close to the first drain region;
   wherein the second storage structure further comprises:
   a fourth sidewall, disposed on sidewall surfaces of the third storage unit and the second sidewalls close to the second drain region.

8. The memory according to claim 2, further comprising:
   a fifth sidewall, disposed on sidewall surfaces of both sides of the source line,
   wherein the fifth sidewall is disposed between the source line and the second storage unit, and between the source line and the fourth storage unit.

* * * * *